United States Patent
Uratani et al.

(10) Patent No.: US 7,529,528 B2
(45) Date of Patent: May 5, 2009

(54) POWER CONSUMPTION CONTROLLING APPARATUS FOR HIGH FREQUENCY AMPLIFIER

(75) Inventors: Munehiro Uratani, Yamatokoriyama (JP); Yuji Kasai, Tsukuba (JP); Tetsuya Higuchi, Tsukuba (JP); Eiichi Takahashi, Tsukuba (JP)

(73) Assignees: Sharp Kabushiki Kaisha, Osaka-Shi (JP); National Institute of Advanced Industrial Science and Technology, Tokyo (JP)

( * ) Notice: Subject to any disclaimer, the term of this patent is extended or adjusted under 35 U.S.C. 154(b) by 624 days.

(21) Appl. No.: 11/213,778

(22) Filed: Aug. 30, 2005

(65) Prior Publication Data

US 2006/0046668 A1    Mar. 2, 2006

(30) Foreign Application Priority Data

Aug. 31, 2004    (JP)    .............................. 2004-253533

(51) Int. Cl.
    *H01Q 11/12*    (2006.01)
(52) U.S. Cl. ................. 455/127.5; 455/127.1; 455/522; 455/115; 455/572
(58) Field of Classification Search ................. 455/127, 455/127.5, 127.1, 522
    See application file for complete search history.

(56) References Cited

U.S. PATENT DOCUMENTS 5,798,665 A    8/1998   Ichihara
5,848,127 A *  12/1998  Levitan et al. ........... 379/22.03
6,148,220 A *  11/2000  Sharp et al. .................. 455/572
2001/0023190 A1* 9/2001 Kim ........................... 455/522
2001/0026600 A1* 10/2001 Mochizuki et al. .......... 375/345
2003/0068989 A1* 4/2003  Harris et al. ................. 455/115

FOREIGN PATENT DOCUMENTS

| JP | 6-85580 A | 3/1994 |
| JP | 7-22857 A | 1/1995 |
| JP | 9-121125 A | 5/1997 |
| JP | 2000-252914 A | 9/2000 |
| JP | 2002-152126 A | 5/2002 |
| JP | 2003-163607 A | 6/2003 |
| JP | 2004-72666 A | 3/2004 |

* cited by examiner

*Primary Examiner*—Matthew D Anderson
*Assistant Examiner*—Adel Youssef
(74) *Attorney, Agent, or Firm*—Birch, Stewart, Kolasch & Birch, LLP (57) ABSTRACT

A power consumption controlling apparatus controls power consumption of a high frequency amplifier to reduce the power consumption by adjusting a power supply voltage and a bias voltage of the high frequency amplifier which amplifies a high frequency transmitting signal. The power consumption controlling apparatus includes: a receiving circuit for receiving the high frequency transmitting signal amplified by the high frequency amplifier; an evaluating section for evaluating whether or not a receiving signal obtained from the receiving circuit satisfies a predetermined quality; and an adjusting section for adjusting the power supply voltage and the bias voltage in a range in which the receiving signal evaluated by the evaluating section satisfies the predetermined quality.

10 Claims, 9 Drawing Sheets

POWER CONSUMPTION CONTROLLING APPARATUS FOR HIGH FREQUENCY AMPLIFIER

This Nonprovisional application claims priority under 35 U.S.C. § 119(a) on Patent Application No. 2004/253533 filed in Japan on Aug. 31, 2004, the entire contents of which are hereby incorporated by reference.

FIELD OF THE INVENTION

The present invention relates to an apparatus for controlling power consumption to reduce the power consumption of a high frequency amplifier included in a system, such as a mobile phone or a wireless LAN.

BACKGROUND OF THE INVENTION

As mobile information devices become more prevalent, there is an increasing demand for a longer continuous operable time and a longer charging battery life of those devices. Especially, there is a strong demand for reducing the power consumption of an RF (Radio Frequency) analog circuit which is the basis of a wireless system.

Figure 8:
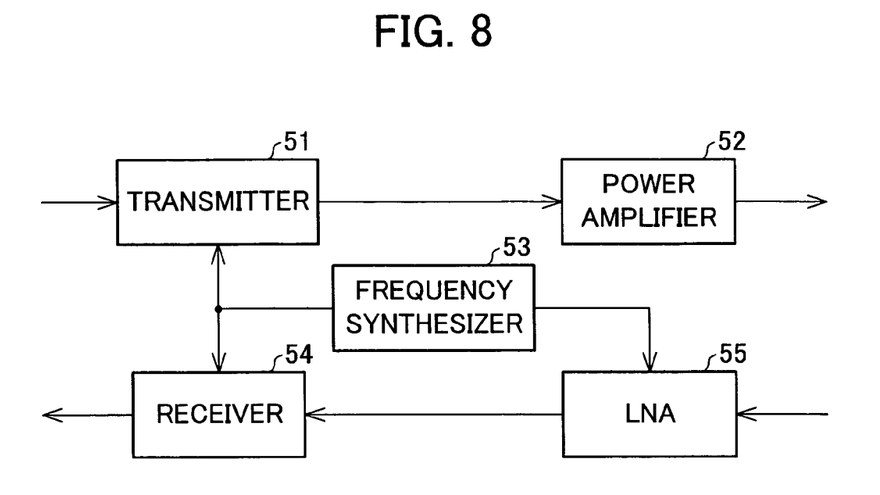
FIG. 8 is a block diagram showing an arrangement of the RF analog circuit in a conventional general wireless system.
Figure 9:
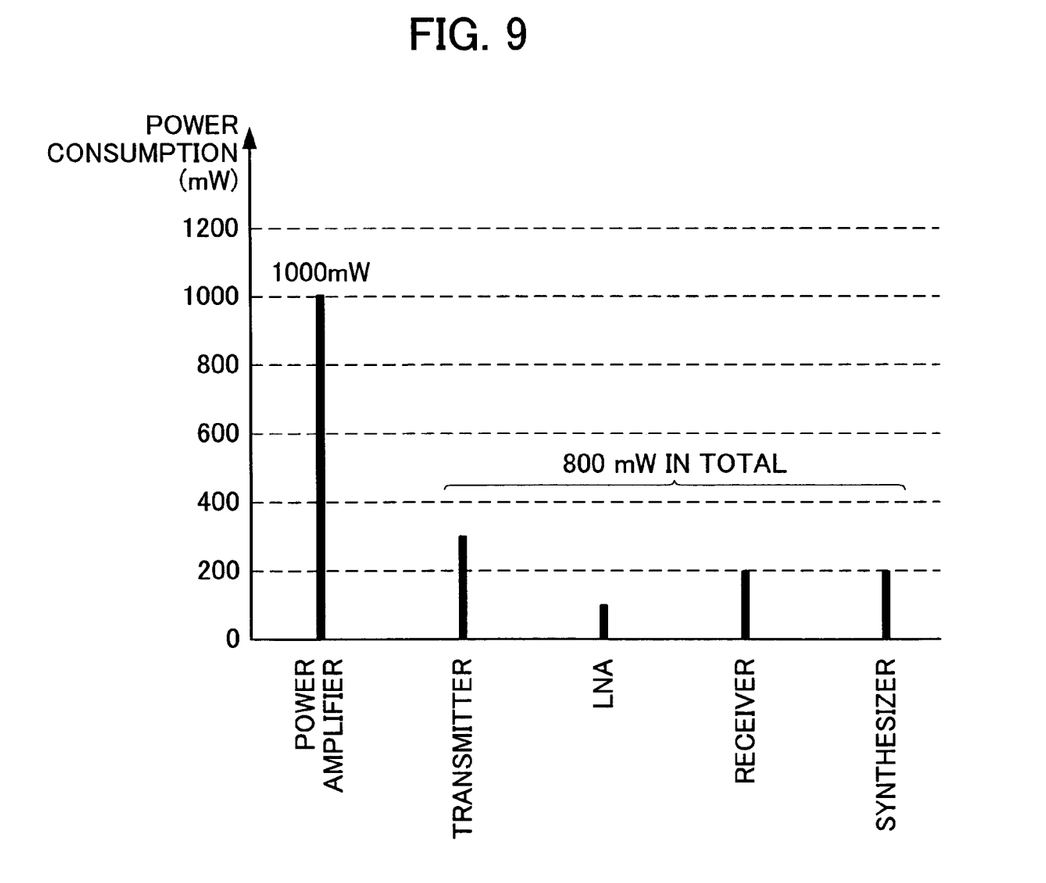
FIG. 9 is a diagram showing a result obtained by measuring a distribution of the power consumption in the RF analog circuit.

FIG. 8 shows an arrangement of the RF analog circuit in a general wireless system. FIG. 9 shows a result obtained by measuring a distribution of the power consumption in the RF analog circuit.

The RF analog circuit generally includes a transmitter 51, a power amplifier 52, a synthesizer 53, an LNA (Low Noise Amplifier) 55, and a receiver 54. A transmitting signal having been outputted from the transmitter 51 is amplified by the power amplifier 52, and then the amplified transmitting signal is transmitted. Meanwhile, a receiving signal is amplified by the LNA 55, and then is subjected to a receiving processing (frequency conversion, demodulation, etc.) by the receiver 54. The frequency synthesizer 53 provides a local signal, necessary for processings, to the transmitter 51, the receiver 54, and the LNA 55.

According to the distribution of the power consumption shown in FIG. 9, the total of the power consumptions of the transmitter 51, the LNA 55, the receiver 54, and the synthesizer 53 is about 800 mW, while the power consumption of the power amplifier 52 is 1,000 mW. That is, the power consumption of the power amplifier 52 accounts for a large part of the power consumption of the RF analog circuit. Therefore, it is evident that reducing the power consumption of the power amplifier 52 is effective to reduce the power consumption of the RF analog circuit. In addition, the power amplifier 52 has a simple circuit configuration, so that the power amplifier 52 can operate even if a power supply voltage is decreased. On this account, it is easy to save power. Moreover, the power consumption of the power amplifier 52 can be adjusted in accordance with a transmitting power (target value). For these reasons, controlling the power consumption of the power amplifier 52 is the best way to reduce the power consumption of the RF analog circuit.

Many approaches to reduce the power consumption of the RF analog circuit in a conventional wireless system have been made mainly by adjusting the power supply voltage and a bias voltage of the power amplifier 52. A conventional technology of adjusting the power supply voltage of an RF power amplifier is disclosed in, for example, U.S. Pat. No. 6,148,220 (published on Nov. 14, 2000). The following explains such conventional technology.

Figure 10:
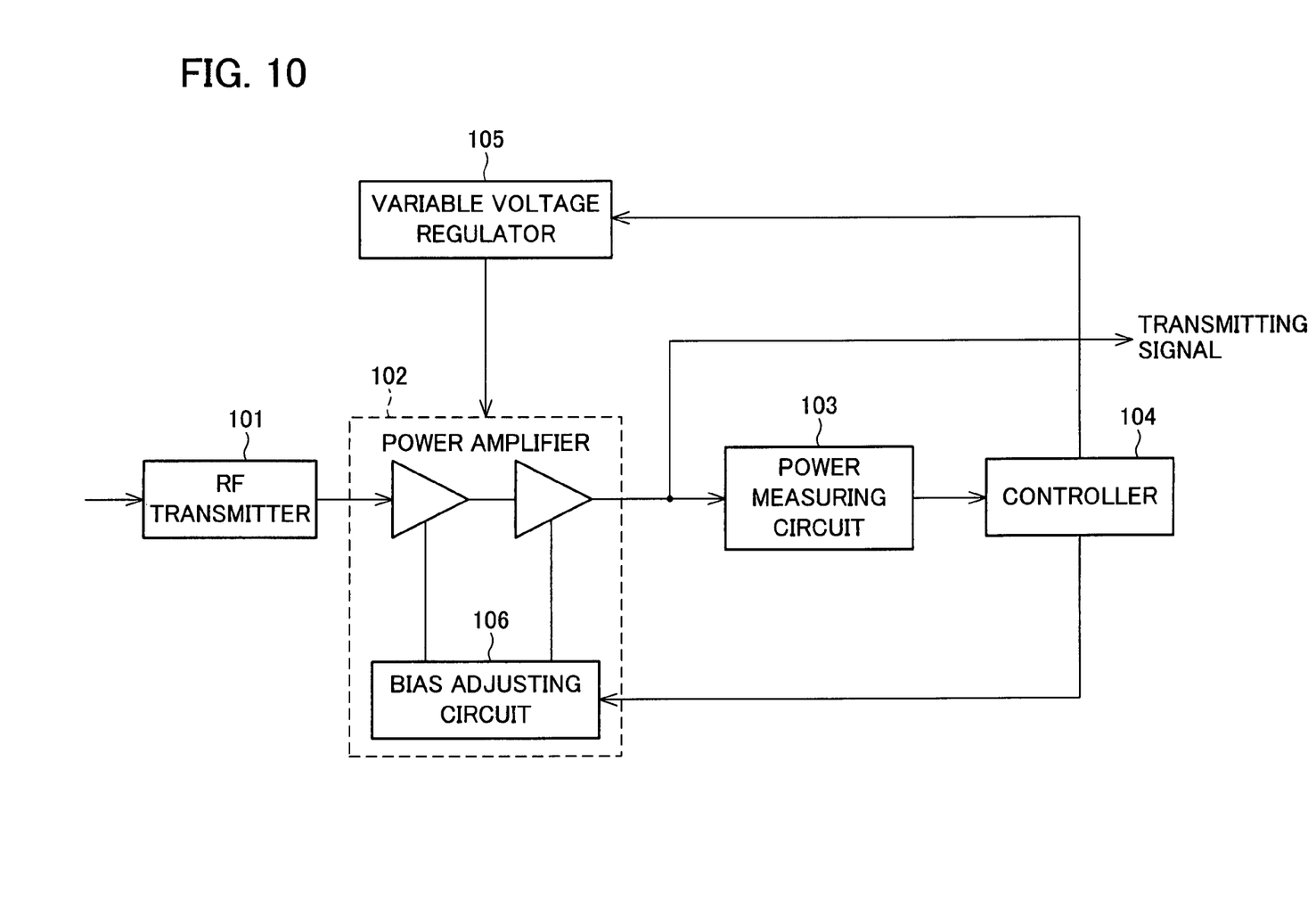
FIG. 10 is a block diagram showing an arrangement of a conventional RF analog circuit having a function of reducing the power consumption.

FIG. 10 shows a simplified arrangement of the conventional technology. As shown in FIG. 10, the arrangement of the conventional technology includes an RF transmitter 101, a power amplifier 102, a power measuring circuit 103, a controller 104, and a variable voltage regulator 105 (power supply voltage adjusting circuit). In this arrangement, a high frequency transmitting signal supplied from the RF transmitter 101 is amplified by the power amplifier 102, and then the power of the high frequency transmitting signal is detected by the power measuring circuit 103. The controller 104 provides an instruction (supplies an adjusting signal) to the variable voltage regulator 105 in accordance with the detected power of the transmitting signal so that the variable voltage regulator 105 controls the power supply voltage. In addition, the controller 104 also provides an instruction (supplies an adjusting signal) to a bias adjusting circuit 106 of the power amplifier 102 in accordance with the detected power of the transmitting signal so that the bias adjusting circuit 106 adjusts the bias voltage. Thus, the variable voltage regulator 105 adjusts the power supply voltage of the power amplifier 102 in accordance with the power of the transmitting signal. Moreover, the power amplifier 102 changes the bias voltage in accordance with the power of the transmitting signal.

In the above arrangement of the conventional technology, the power supply voltage and the bias voltage of the power amplifier 102 are adjusted to improve characteristics. However, the conventional technology does not refer to a quantitative adjustment range which indicates to what extent the power supply voltage and the bias voltage can be adjusted without deteriorating a signal quality. Therefore, even in the case in which signal distortion occurs when the power supply voltage of the power amplifier 102 is reduced, the deterioration in signal quality cannot be improved.

Because variations in characteristics, such as a threshold voltage and the like, of a transistor are increased due to a deeper submicron semiconductor process, variations in characteristics of the circuit also become significant. On this account, a method for adjusting the power supply voltage to obtain an optimal power supply voltage for each device becomes necessary.

Therefore, in the case of employing the conventional technology, there is no other choice but to (i) take an excessive margin with respect to a lower limit of the power supply voltage to secure a high signal quality or (ii) adjust the power supply voltage and the bias voltage while ignoring the signal quality.

SUMMARY OF THE INVENTION

An object of the present invention is to provide a power consumption controlling apparatus which can optimally adjust parameters such as a power supply voltage to minimize power consumption of a power amplifier while satisfying desired target characteristics (especially, signal: quality).

In order to achieve the above object, a power consumption controlling apparatus of the present invention controls power consumption of a high frequency amplifier, which amplifies a high frequency transmitting signal, to reduce the power consumption by adjusting a power supply voltage and a bias voltage of the high frequency amplifier, and the power consumption controlling apparatus includes: a receiving circuit for receiving the high frequency transmitting signal amplified by the high frequency amplifier; an evaluating section for evaluating whether or not a receiving signal obtained from the receiving circuit satisfies a predetermined quality; and an adjusting section for adjusting the power supply voltage and the bias voltage in a range in which the receiving signal evaluated by the evaluating section satisfies the predetermined quality.

According to, the above arrangement, the evaluating section evaluates whether or not the receiving signal obtained from the receiving circuit satisfies a predetermined quality. Thus, by evaluating the quality of the receiving signal, the quality of the transmitting signal is evaluated. Then, the power supply voltage and the bias voltage are adjusted by the adjusting section to reduce the power consumption of the high frequency amplifier in a range in which the receiving signal satisfies a predetermined quality, that is, in a range in which the high frequency transmitting signal satisfies a predetermined quality. With this, it becomes possible to reduce the power consumption of the high frequency amplifier while maintaining the required quality of the high frequency transmitting signal.

Additional objects, features, and strengths of the present invention will be made clear by the description below. Further, the advantages of the present invention will be evident from the following explanation in reference to the drawings.

DESCRIPTION OF THE EMBODIMENTS

The following explains one embodiment of the present invention in reference to FIGS. 1 to 7.

Figure 1:
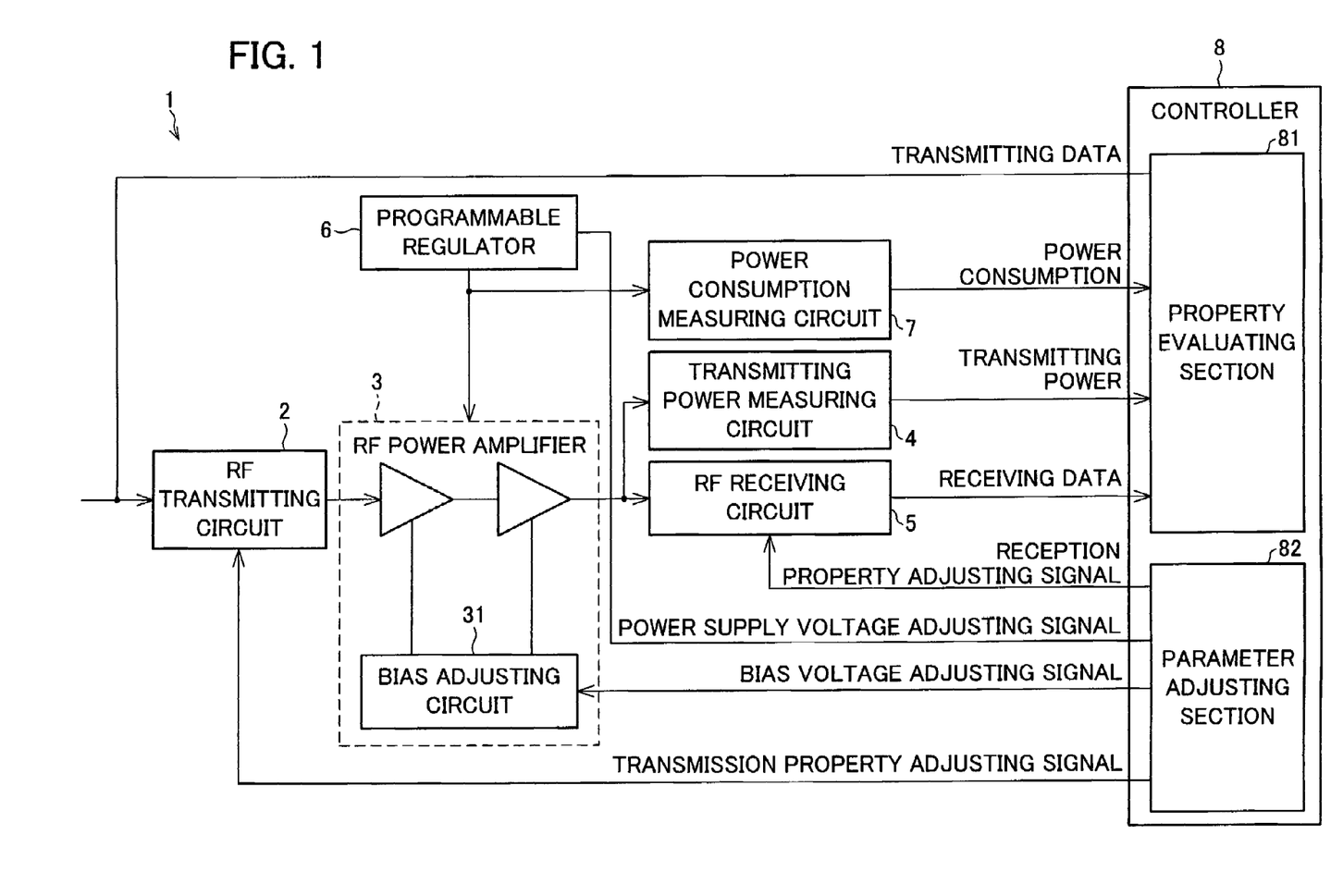
FIG. 1 is a block diagram showing an arrangement of substantial parts of a transmitting system in accordance with one embodiment of-the present invention.
Figure 2:
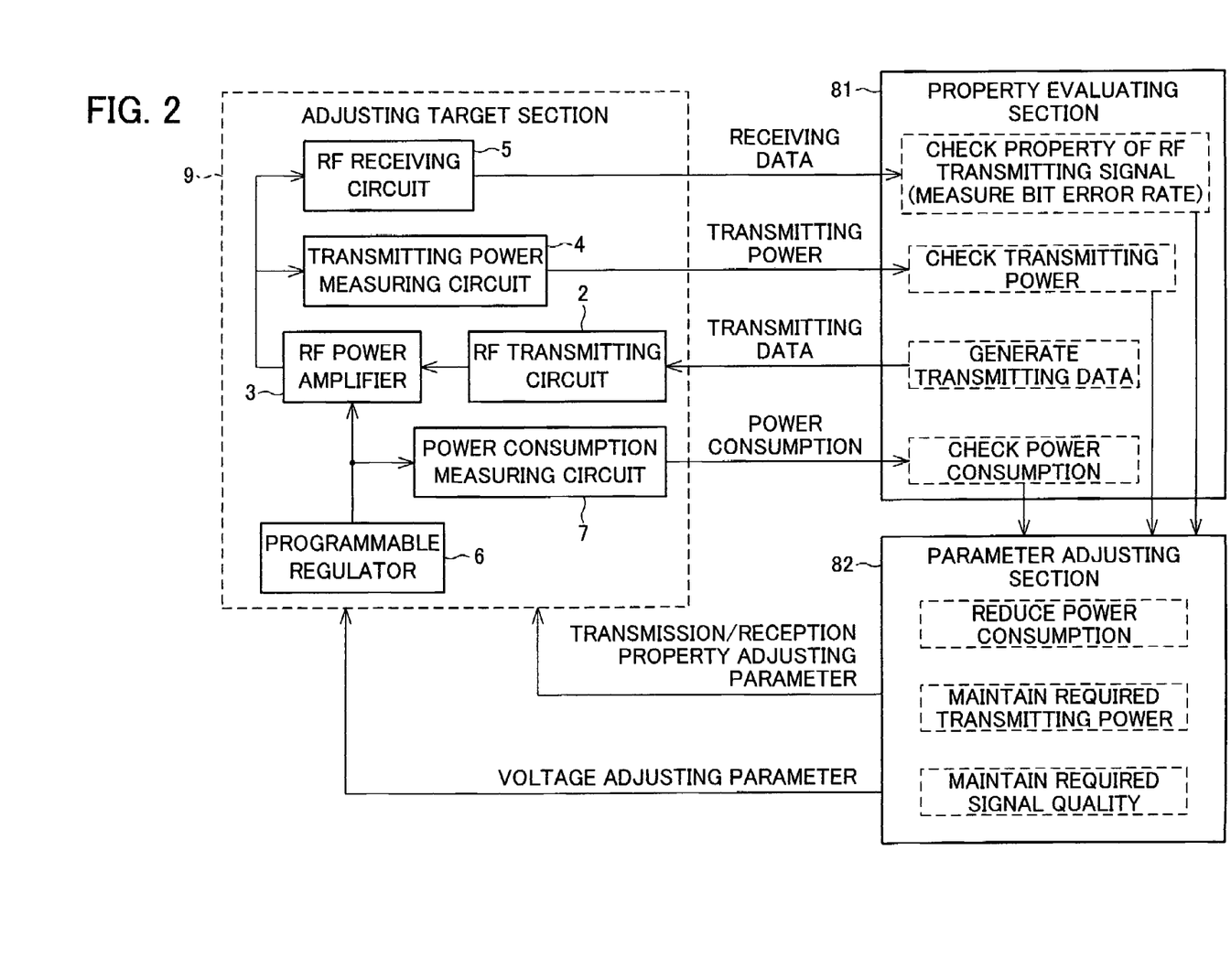
FIG. 2 is a block diagram showing an adjusting system of the transmitting system.

FIG. 1 shows an arrangement of substantial parts of a transmitting system 1 of the present embodiment. FIG. 2 shows an adjusting system of the transmitting system 1. The transmitting system 1 is applied to, for example, an IEEE802.11b wireless LAN system having a plurality of power sources.

As shown in FIG. 1, the transmitting system 1 includes an RF transmitting circuit 2, an RF power amplifier 3, a transmitting power measuring circuit 4, an RF receiving circuit 5, a programmable regulator 6, a power consumption measuring circuit 7, and a controller 8.

The RF transmitting circuit 2 is a circuit which converts an inputted baseband transmitting data into an analog IF signal and then upconverts the IF signal to generate a transmitting signal of transmission frequency.

The RF power amplifier 3 is an amplifier which amplifies the transmitting signal supplied from the RF transmitting circuit 2. The RF power amplifier 3 includes a bias adjusting circuit 31 which adjusts a bias voltage in accordance with a bias voltage adjusting signal supplied from the controller 8.

The transmitting power measuring circuit 4 is a circuit which measures power of the transmitting signal amplified by the RF power amplifier 3. The transmitting power measuring circuit 4 converts the power of the transmitting signal into a voltage value.

The RF receiving circuit 5 is a circuit which (i) converts the transmitting signal supplied from the RF power amplifier 3 into an IF signal, (ii) downconverts the IF signal to generate a baseband receiving signal, and (iii) outputs the receiving signal as a digital receiving data. Moreover, the RF receiving circuit 5 acts in the transmitting system 1 as a loopback circuit which processes the transmitting signal for reception.

The programmable regulator 6 is a variable output type power supply circuit which supplies electric power to respective parts in the transmitting system 1 including the RF power amplifier 3. The programmable regulator 6 adjusts the supply voltage of the RF power amplifier 3 in accordance with a power supply voltage adjusting signal supplied from the controller 8. Moreover, the programmable regulator 6 has a plurality of power supply outputs so as to supply power supply voltages to respective parts of an adjusting target section 9, and the programmable regulator 6 can be applied to the IEEE802.11b wireless LAN system.

The power consumption measuring circuit 7 is a circuit which measures the power consumption of the RF power amplifier 3 in accordance with an output voltage of the programmable regulator 6. A method for measuring the power consumption by the power consumption measuring circuit 7 is not especially limited, and it is possible to use any well-known method for measuring the power consumption of a power supply circuit.

The controller 8 is a circuit which carries out a process for reducing the power consumption of the RF power amplifier 3 while maintaining the transmitting power and the signal quality to be a desired level. The controller 8 is composed of, for example, a microcomputer, and includes a property evaluating section 81 and a parameter adjusting section 82 to carry out the above process.

As shown in FIG. 2, the property evaluating section 81 has functions of generating transmitting data, checking a property of an RF transmitting signal, checking the transmitting power, and checking the power consumption. By using the function of generating the transmitting data, the property evaluating section 81 generates test transmitting data used for adjustment. Moreover, by using the function of checking the property of the RF transmitting signal, the property evaluating section 81 measures bit error rate (BER) of the receiving data supplied from the RF receiving circuit 5, and then checks whether or not the bit error rate is equal to or less than a predetermined value. Here, the property evaluating section 81 is a transmitter and also a receiver, so that the transmitting data transmitted from the transmitter is known by the receiver. On this account, the property evaluating section 81 measures the bit error rate by (i) outputting a large quantity of data, and (ii) measuring a ratio of errors in the data received by the property evaluating section 81. For example, in the case in which data of $10^5$ bits are transmitted and an error of 10 bits is detected, the bit error rate is $10^{-4}$.

Moreover, by using the function of checking the transmitting power, the property evaluating section 81 checks whether or not the transmitting power supplied from the transmitting power measuring circuit 4 has a value in a predetermined range. Specifically, the property evaluating section 81 compares a measured transmitting power with a target transmitting power to find out whether or not the measured transmitting power is in an allowable range (for example, ±0.5 dBm) determined by the target transmitting power.

Moreover, by using the function of checking the power consumption, the property evaluating section 81 supplies to the parameter adjusting section 82 the power consumption of the RF power amplifier 3 with check results of corresponding transmitting signal property and transmitting power, the power consumption being sequentially measured by the power consumption measuring circuit 7 in accordance with various adjusting parameter.

The parameter adjusting section 82 generates a voltage adjusting parameter and a transmission property adjusting parameter in accordance with the RF transmitting signal property, the transmitting power, and the power consumption checked by the property evaluating section 81 so that the power consumption of the RF power amplifier 3 is reduced while securing the transmitting signal property to be a predetermined level or more and the transmitting power in the predetermined range. The parameter adjusting section 82 repeats a process of generating the above two parameters for each check result of the property evaluating section 81, until the power consumption becomes minimum.

As shown in FIG. 1, the parameter adjusting section 82 generates as the voltage adjusting parameters (i) the power supply voltage adjusting signal supplied to the programmable regulator 6 and (ii) the bias voltage adjusting signal supplied to the bias adjusting circuit 31 of the RF power amplifier 3. Moreover, as transmission/reception property adjusting parameters, the parameter adjusting section 82 generates (i) a transmission property adjusting signal supplied to the RF transmitting circuit 2 and (ii) a reception property adjusting signal supplied to the RF receiving circuit 5. The transmission property adjusting signal is a signal for adjusting transmission gain, and the reception property adjusting signal is a signal for adjusting reception gain.

Note that in the generation of the voltage adjusting parameters, the parameter adjusting section 82 divides the transmitting power by the power consumption to find efficiency of the RF power amplifier 3, and selects the voltage adjusting parameter (combination of the power supply voltage and the bias voltage) which maximizes this efficiency.

The RF transmitting circuit 2, the RF power amplifier 3, the transmitting power measuring circuit 4, the RF receiving circuit 5, the programmable regulator 6, and the power consumption measuring circuit 7 constitute the adjusting target section 9 to which the voltage adjusting parameter and the transmission/reception property adjusting parameter are provided. The adjusting target section 9 is the target of the control in the power consumption of the power amplifier in accordance with the above two parameters, and has a function of the IEEE802.11b wireless LAN.

The property evaluating section 81 and the parameter adjusting section 82 are functional blocks realized by causing a processing section of the controller 8 to execute a program (power consumption controlling program) stored in a memory or the like (recording medium) of the controller 8. Moreover, the following parameter adjusting process carried out by the property evaluating section 81 and the parameter adjusting section 82 is realized by causing the processing section of the controller 8 to execute the program. Further, the program may be recorded in a removable recording medium.

The following explains the parameter adjusting process in the transmitting system 1 arranged as above.

First, the property evaluating section 81 generates the test transmitting data and provides it to the adjusting target section 9. Next, the RF transmitting circuit 2 in the adjusting target section 9 generates the transmitting signal from the provided transmitting data in accordance with a normal transmitting function, and then the transmitting signal is amplified by the RF power amplifier 3. After that, the transmitting power measuring circuit 4 measures the transmitting power of the amplified transmitting signal, and then the measured transmitting power is offered to the property evaluating section 81. At the same time, loopback of the amplified transmitting signal to the RF receiving circuit 5 is carried out to check a quality of the transmitting signal. The RF receiving circuit 5 generates the receiving data and provides it to the property evaluating section 81. Further, the power consumption measuring circuit 7 measures the power consumption of the RF power amplifier 3 at the time of measuring the transmitting power, and offers the measured power consumption to the property evaluating section 81.

Furthermore, the property evaluating section 81 checks the property of the RF transmitting signal (measurement of the BER), the transmitting power, and the power consumption in accordance with the receiving data, the transmitting power, and the power consumption offered from the adjusting target section 9. Then, check results of the property of the RF transmitting signal, the transmitting power, and the power consumption are offered to the parameter adjusting section 82.

The parameter adjusting section 82 determines the power supply voltage adjusting parameter and the transmission/reception property adjusting parameter in accordance with the check results of the property of the RF transmitting signal, the transmitting power, and the power consumption offered from the property evaluating section 81 so that both the reduction in the power consumption and the maintaining of a predetermined transmitting power and signal quality are realized. Then, the parameter adjusting section 82 offers the above two parameters to the adjusting target section 9. In the adjusting target section 9, the power supply voltage of the programmable regulator 6 and the settings of the transmission property of the RF transmitting circuit 2 are updated in accordance with the power supply voltage adjusting parameter and the transmission/reception property adjusting parameter offered from the parameter adjusting section 82.

By repeating a series of these process steps, the power supply voltage of the programmable regulator 6 and the settings of the transmission property of the RF transmitting circuit 2 gradually become close to an optimal value by which the power consumption of the RF power amplifier 3 becomes minimum while maintaining the predetermined transmitting power and signal quality. Then, the process is terminated when a desired result is obtained.

Figure 3:
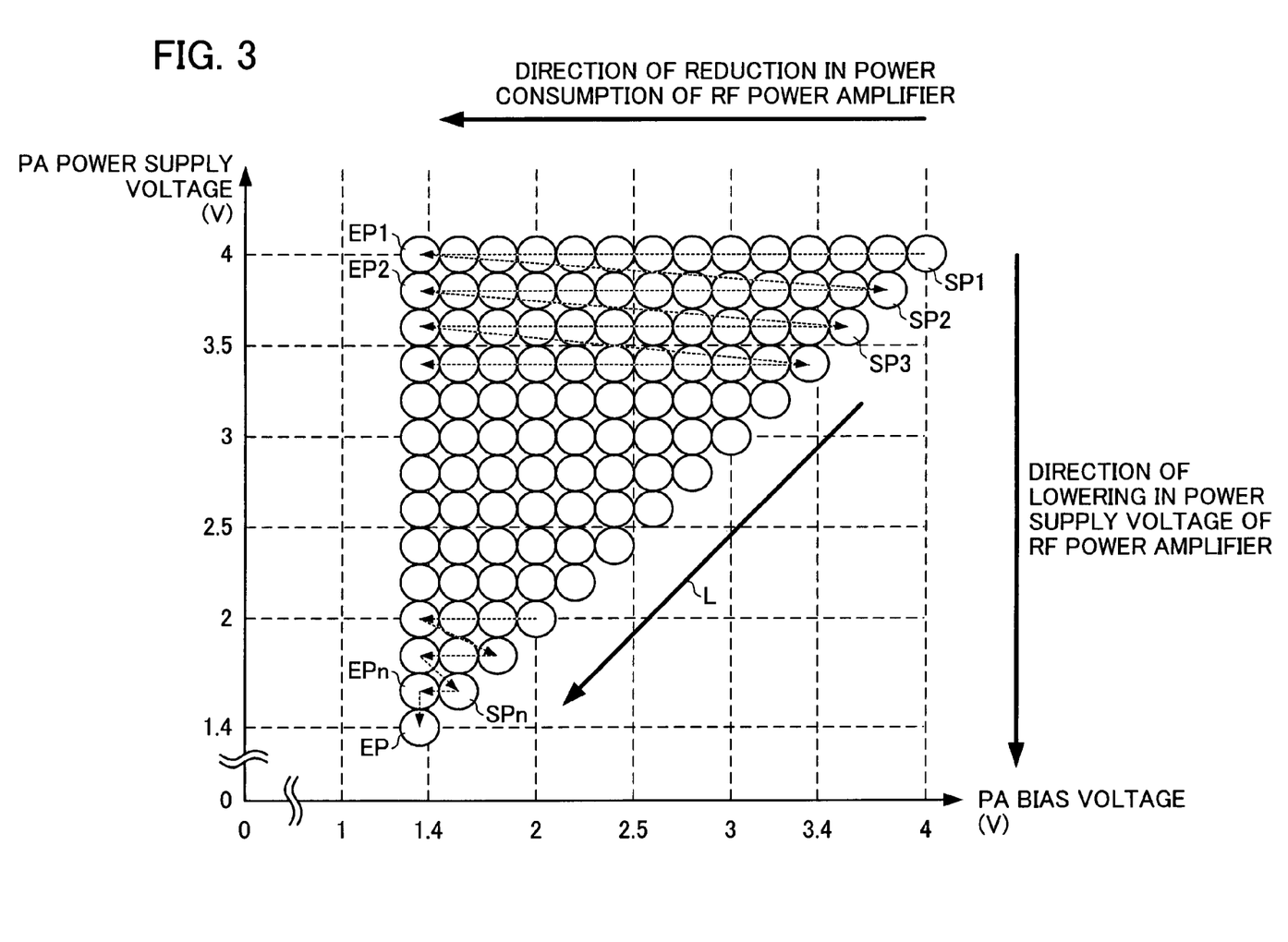
FIG. 3 is a diagram showing a concrete example of a parameter adjustment which is carried out in the transmitting system.

FIG. 3 shows a concrete example of the parameter adjusting process.

In FIG. 3, the vertical axis represents the power supply voltage (PA power supply voltage) of the RF power amplifier 3, and the horizontal axis represents the bias voltage (PA bias voltage) of the RF power amplifier 3.

A measurement and an adjusting process are started from a start measurement point SP1 in which the PA power supply voltage=4 V and the PA bias voltage=4 V. While reducing the PA power supply voltage and/or the PA bias voltage, the BER, the transmitting power, and the power consumption are measured at each measurement point indicated by a circle in FIG. 3. In the case of reducing the PA power supply voltage and the PA bias voltage, the power consumption of the RF power amplifier 3 decreases in proportion to a product of the PA power supply voltage and the PA bias voltage. Therefore, by adjusting the PA power supply voltage and/or the PA bias voltage, it becomes possible to find the measurement point at which a minimum power consumption satisfying the target values of the transmitting power and the BER can be obtained.

The following explains details of a procedure for adjusting the parameters.

A measurement concerning the following items (1) to (4) are carried out for all the points which are provided with a certain interval therebetween in a two-dimensional space formed by the power supply voltage and the bias voltage of the RF power amplifier 3.

(1) the transmitting power (in a range of ±0.5 dB (target value))
(2) the bit error rate (BER)
(3) the power consumption of the RF power amplifier 3
(4) the efficiency of the RF power amplifier 3 (obtained by dividing the transmitting power by the power consumption)

The above items are measured in, for example, the following order.

First, the value of the transmitting power is set by selecting from 26, 24, 22, 20, 18, 16, 14, 12, 10, and 8 (dBm). Next, The measurement is started from the start measurement point SP1 ((PA power supply voltage, PA bias voltage)=(4.0 V, 4.0 V)). As indicated by a dashed arrow in FIG. 3, the PA bias voltage is reduced at 0.2 V intervals.

Then, the reduction of the PA bias voltage is stopped when any one of the following conditions (A) and (B) occurs (measurement point EP1).

(A) Limit of adjustment of parameter capable of maintaining the transmitting power in a predetermined range
(B) Lower limit of the bias voltage (1.4 V)

Then, the measurement point moves to a measurement point SP2 in which the PA bias voltage and the PA power supply voltage are 0.2 V lower than those of the measurement point SP1, respectively, that is, (PA power supply voltage, PA bias voltage)=(3.8 V, 3.8 V). Then, the measurement continues while reducing the bias voltage at 0.2 V intervals. When the condition (A) or (B) occurs (measurement point EP2), the reduction of the PA bias voltage is stopped. Subsequently, the measurement is repeatedly carried out, for example, from (i) a measurement point SP3 (SP4, . . . , SPn) at which the PA bias voltage and the PA power supply voltage are 0.2 V lower than those at the previous measurement point SP2 (SP3, . . . , SPn−1), respectively, until (ii) a measurement point EP3 (EP4, . . . , EPn) at which the condition (A) or (B) occurs. The measurement ends at a final measurement point EP in which the power consumption of the RF power amplifier 3 is minimum.

In the above measurement, the PA bias voltage of the measurement point (SP2, . . . , SPn) is set sequentially reduced in a direction of an arrow L in FIG. 3 at 0.2 V intervals.

The adjustment of parameters is accordingly carried out in a state in which, after the shipment of a product including the transmitting system 1, a user is using the product. For example, because the value of the transmitting power is determined in accordance with a negotiation with a partner before communicating data, a software executes the adjustment of the above-described various parameters so that the determined value is set as the target value and the signal quality is not deteriorated.

Figure 4:
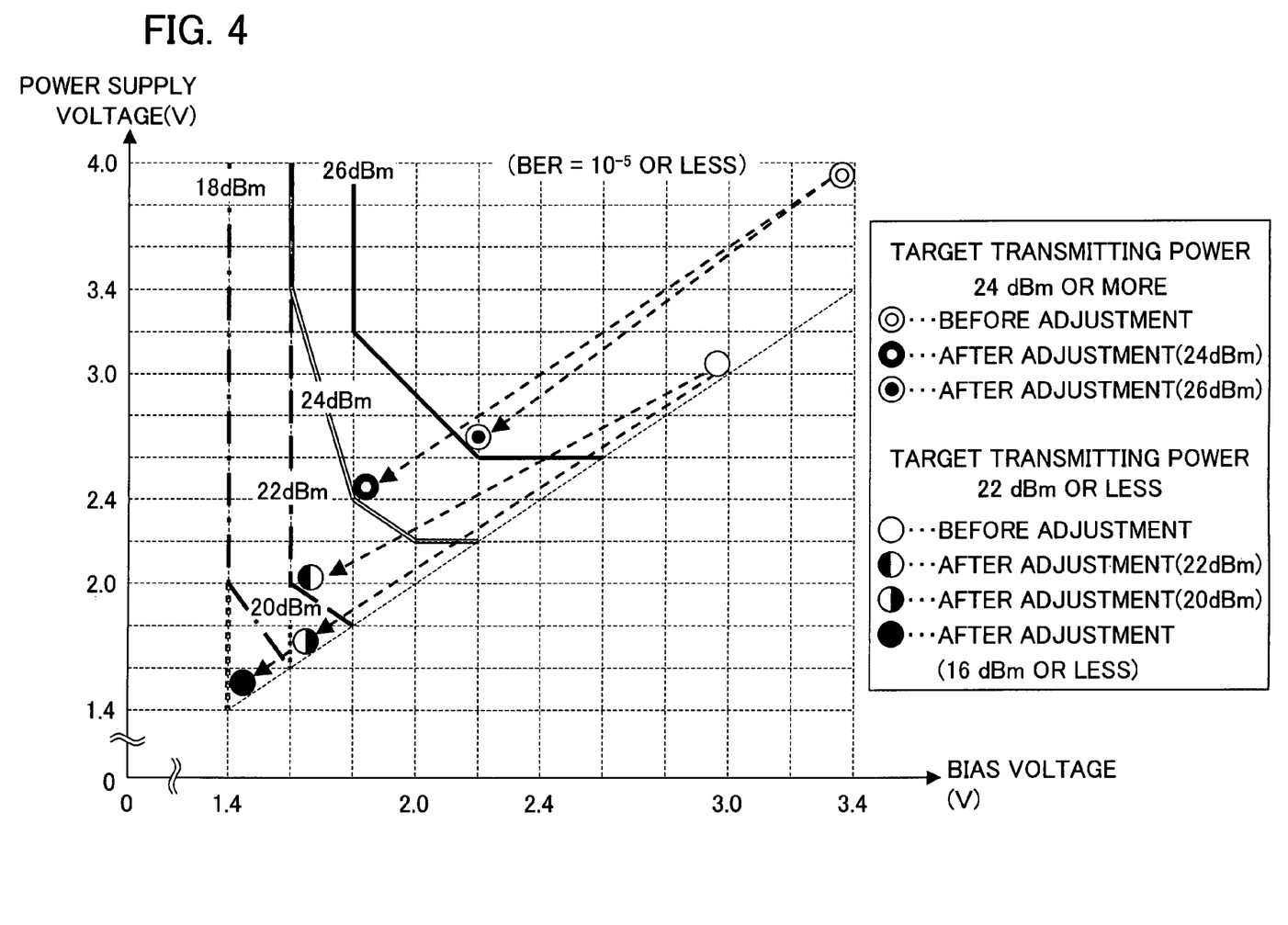
FIG. 4 is a diagram showing a range of parameters by which a desired transmitting power can be secured in the transmitting system.
Figure 5:
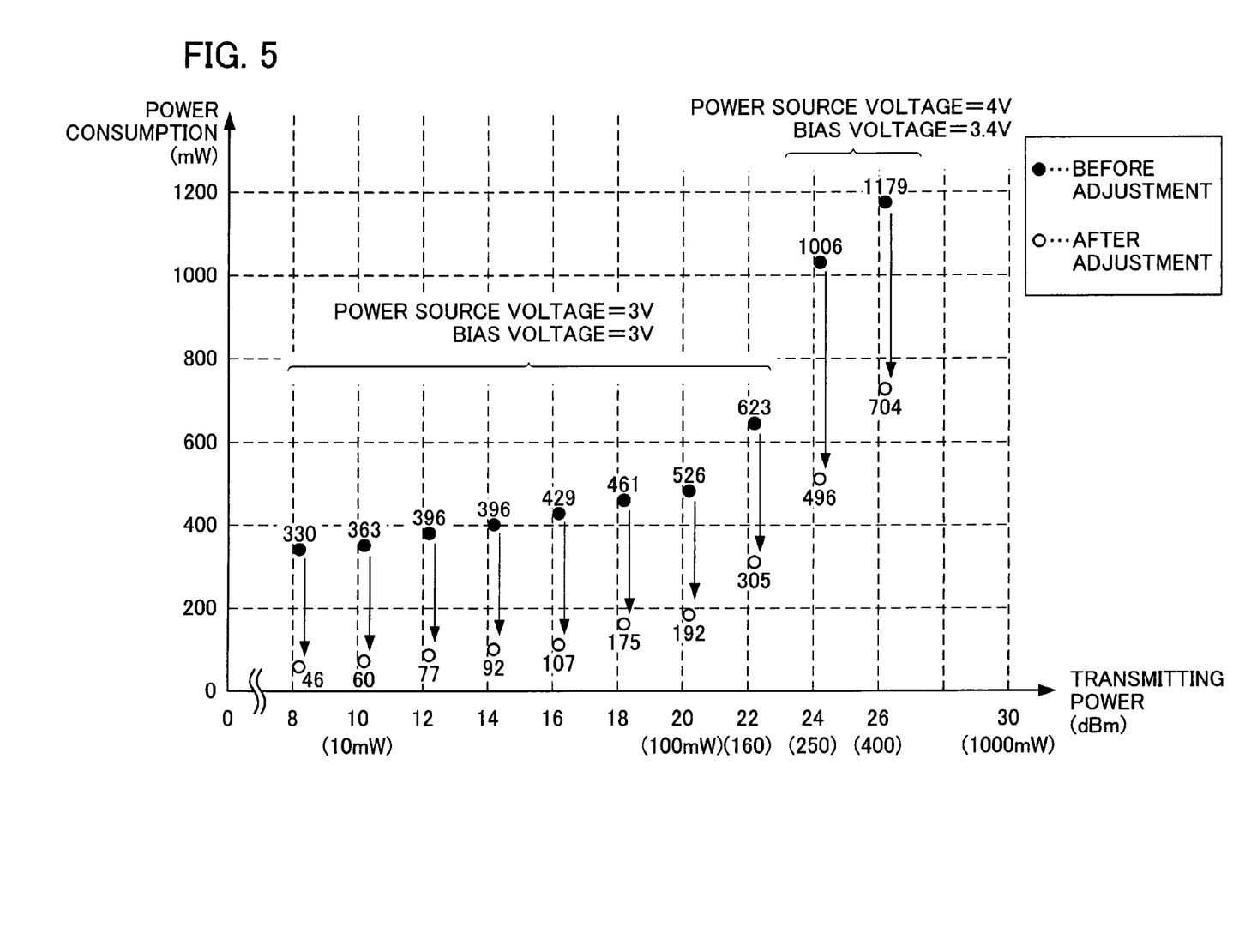
FIG. 5 is a diagram showing an effect of reducing the power consumption of the RF power amplifier in the transmitting system, the effect being obtained by the parameter adjustment.

The following explains an effect (result obtained by actual measurement) of the adjustment of parameters in the transmitting system 1. FIG. 4 shows a range of parameters by which a desired transmitting power can be obtained. FIG. 5 shows an effect of the reduction of the power consumption.

In FIG. 4, the vertical axis represents the power voltage of the RF power amplifier 3, and the horizontal axis represents the bias voltage of the RF power amplifier 3. As shown in FIG. 4, an adjustable range is determined as a result of the adjustment of parameters, the adjustable range in which the voltages (the power supply voltage and the bias voltage) of the RF power amplifier 3 can be adjusted while obtaining the target transmitting power (26 dBm, 24 dBm, 22 dBm, 20 dBm, or, 16 dBm or less). The voltages which are not yet adjusted and used as references are (Power supply voltage, Bias voltage) =(4.0 V, 3.4 V) in the case in which the target transmitting power is 24 dBm, and are (Power supply voltage, Bias voltage)=(3.0 V, 3.0 V) in the case in which the target transmitting power is 22 dBm or less. Moreover, as the target transmitting power becomes larger, the RF power amplifier 3 requires a higher gain. Therefore, it is necessary to increase the supply voltages of the RF power amplifier 3. For example, the voltages can be reduced down to (Power supply voltage, Bias voltage)=(2.6 V, 2.2 V) in the case in which the target transmitting power is 26 dBm, and down to (Power supply voltage, Bias voltage)=(1.4 V, 1.4 V) in the case in which the target transmitting power is 16 dBm or less.

In FIG. 5, the vertical axis represents an amount of reduction in the power consumption, and the horizontal axis represents the target transmitting power. Values in two lines along the horizontal axis are the values of the transmitting power. The values in the upper line are expressed in units of dBm, and the values in the lower line are expressed in units of mW. Those values are converted to each other by $dBm = 10 \cdot \log_{10}(mW)$. For example, 1,000 mW is equivalent to 30 dBm ($= 10 \cdot \log_{10}(1,000)$).

As shown in FIG. 4, as a reference value of the power consumption which is not yet adjusted, (a) a value of the power consumption of (Power supply voltage, Bias voltage) =(4.0 V, 3.4 V) is used in the case in which the transmitting power is 24 dBm or more, and (b) a value of the power consumption of (Power supply voltage, Bias voltage)=(3.0 V, 3.0 V) is used in the case in which the transmitting power is 22 dBm or less. As shown in FIG. 5, the amount of reduction of the power consumption becomes larger as the transmitting power becomes larger. The amount of reduction of the power consumption is approximately 500 mA in the case of (a), and is approximately from 300 mA to 400 mA in the case of (b).

As described above, the transmitting system 1 of the present embodiment is arranged as follows.

(1) The transmitting signal from the RF transmitting circuit 2 is amplified by the RF power amplifier 3, and then the amplified transmitting signal is looped back to the RF receiving circuit 5.

(2) Based upon the receiving data from the RF receiving circuit 5, the property evaluating section 81 checks whether or not the property of the transmitting signal is in a predetermined range.

(3) The transmitting power measuring circuit 4 measures the transmitting power of the transmitting signal offered from the RF power amplifier 3.

(4) The power consumption measuring circuit 7 measures the power consumption of the RF power amplifier 3.

(5) The property evaluating section 81 checks whether or not the transmitting power is in a predetermined range.

(6) The property evaluating section 81 determines the power supply voltage and the bias voltage of the RF power amplifier 3 so that the reduction of the power consumption, a predetermined transmitting power, and the signal quality are maintained.

By evaluating the quality of the transmitting signal and the power consumption of the RF power amplifier 3, it becomes possible to reduce the power consumption of the RF power amplifier 3 while maintaining the quality of the transmitting signal in a desired range. Such evaluation is not carried out in the conventional arrangement. In addition, the parameter adjusting section 82 determines the power supply voltage and the bias voltage to maximize the efficiency of the RF power amplifier 3, so that it becomes possible to operate the RF power amplifier 3 with low power consumption but high efficiency. Further, because there is a function of adjusting gain of the system in addition to a function of adjusting the voltages of the RF power amplifier 3, it becomes possible to minimize the power consumption of the RF power amplifier 3 while satisfying the desired target property.

Figure 6:
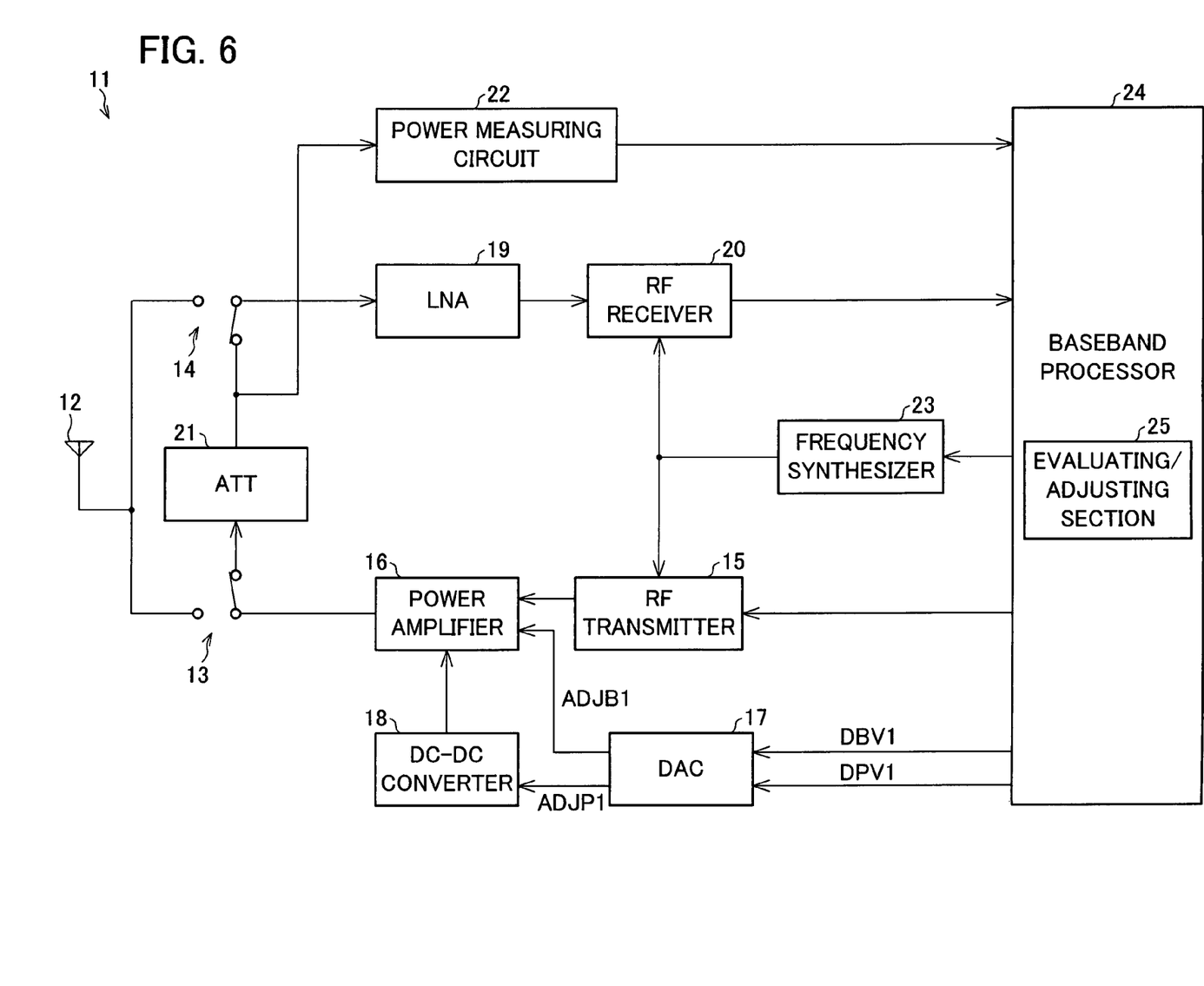
FIG. 6 is a block diagram showing an arrangement of substantial parts of a time division duplex system adopting the transmitting system.
Figure 7:
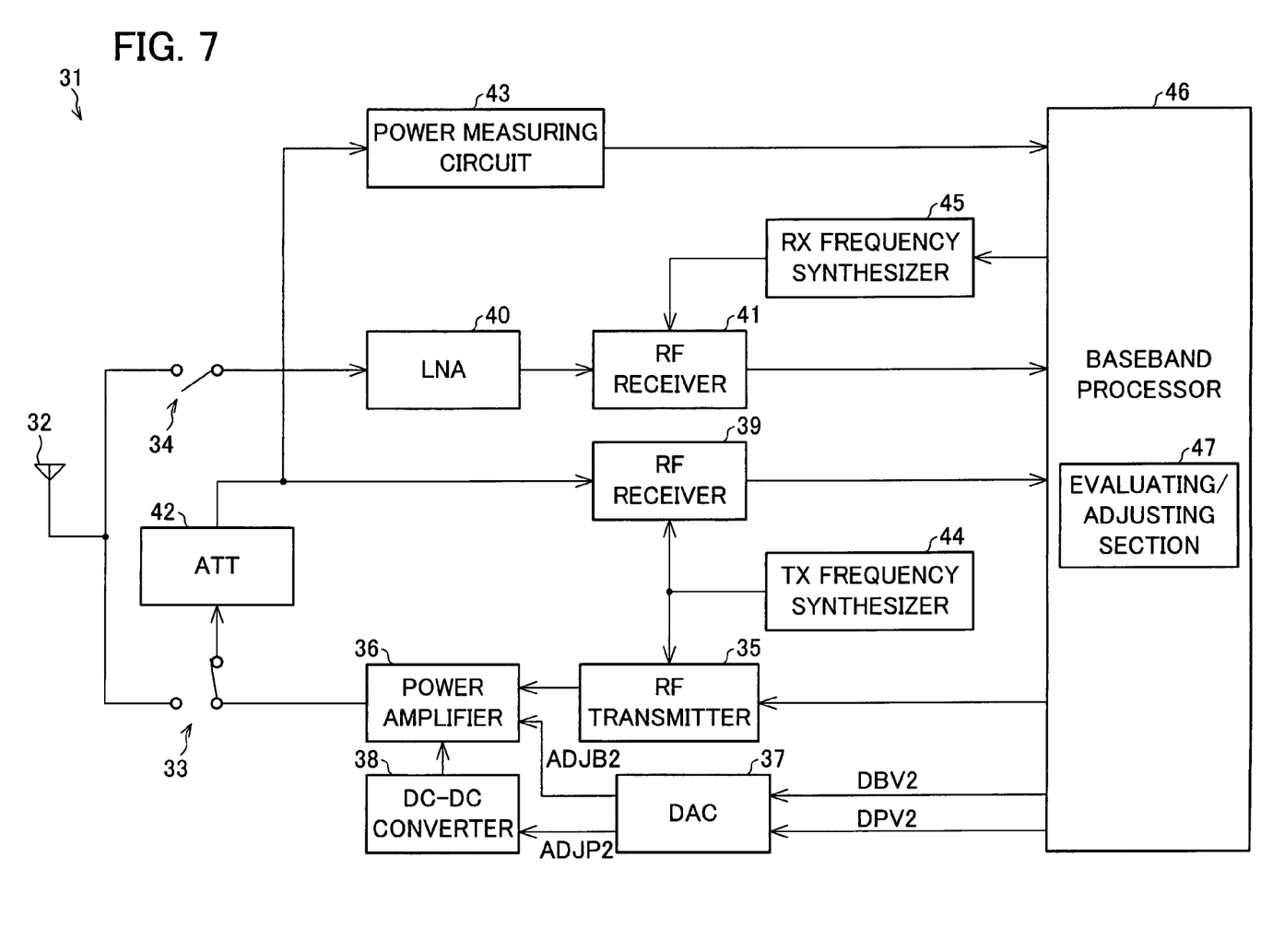
FIG. 7 is a block diagram showing an arrangement of substantial parts of a frequency division duplex system adopting the transmitting system.

The following continues to explain applications of the transmitting system 1. FIG. 6 shows an arrangement of a time division duplex system 11 in, for example, the wireless LAN. FIG. 7 shows an arrangement of a frequency division duplex system 31 in, for example, the mobile phone.

The time division duplex system 11 shown in FIG. 6 is a system which carries out time division duplex (TDD), and is preferably used in, for example, a wireless LAN system. The TDD is one of methods for realizing simultaneous transmission/reception (duplex communication) in, for example, wireless communication. According to the TDD, by dividing a time axis into (i) short intervals in which a communication path for transmission becomes effective and (ii) short intervals in which a communication path for reception becomes effective, the transmission and the reception are switched over quickly in accordance with the division. In the TDD, the transmission and the reception are switched over many times in a short period of time. In this way, pseudo simultaneous transmission/reception is realized at the same frequency.

The time division duplex system 11 includes an antenna 12, mode selector switches 13 and 14, an RF transmitter 15, a power amplifier 16, a digital-analog converter (DAC in FIG. 6) 17, a DC-DC converter 18, a low noise amplifier (LNA in FIG. 6) 19, an RF receiver 20, an attenuator 21, a power measuring circuit 22, a frequency synthesizer 23, and a baseband processor 24. The baseband processor 24 further includes an evaluating/adjusting section 25. A TDD system section is generally composed of the RF transmitter 15, the power amplifier 16, the DC-DC converter 18, the low noise amplifier 19, the RF receiver 20, the frequency synthesizer 23, and the baseband processor 24.

The RF transmitter 15, the power amplifier 16, the DC-DC converter 18, the RF receiver 20, the power measuring circuit 22 correspond to the RF transmitting circuit 2, the RF power amplifier 3, the programmable regulator 6, the RF receiving circuit 5, and the transmitting power measuring circuit 4 in FIG. 1, respectively.

In the time division duplex system 11, the transmitting signal and the receiving signal are in the same frequency band. Therefore, the RF receiver 20 which is originally included in the TDD system can be utilized as a loopback circuit (RF receiving circuit 5) which obtains the transmitting signal as the receiving signal to evaluate the quality of the transmitting signal. On this account, by adding to the TDD system the mode selector switches 13 and 14, the digital-analog converter 17, the attenuator 21, the transmitting power measuring circuit 22, the evaluating/adjusting circuit 25, and a power consumption measuring circuit (having functions equivalent to those of the power consumption measuring circuit 7, not shown in FIG. 6), it becomes possible to carry out the power supply adapting adjustment which is realized in the transmitting system 1 shown in FIG. 1.

The mode selector switches 13 and 14 are switches which select a normal transmission/reception mode or an adjusting mode. In the normal transmission/reception mode, the mode selector switches 13 and 14 connect the antenna 12 with the power amplifier 16 and the low noise amplifier 19. Meanwhile, in the adjusting mode, the mode selector switches 13 and 14 connect the attenuator 21 with the power amplifier 16 and the low noise amplifier 19. Switching operations carried out by the mode selector switches 13 and 14 are controlled by the baseband processor 24 or another control section.

The digital-analog converter 17 converts power supply voltage adjusting data DPV1 and bias voltage adjusting data DBV1 into power supply voltage adjusting signal ADJP1 and bias voltage adjusting signal ADJB1, respectively. Here, the power supply voltage adjusting data DPV1 and the bias voltage adjusting data DBV1 are outputted from the evaluating/adjusting section 25, and the power supply voltage adjusting signal ADJP1 and the bias voltage adjusting signal ADJB1 are analog signals. The power supply voltage adjusting signal ADJP1 is supplied to the DC-DC converter 18, and the bias voltage adjusting signal ADJB1 is supplied to the power amplifier 16. The digital-analog converter 17 may be contained in the baseband processor 24.

The attenuator 21 attenuates the transmitting signal from the power amplifier 16 so that the power of the transmitting signal can be measured by the power measuring circuit 22.

The evaluating/adjusting section 25 includes the property evaluating section 81 and the parameter adjusting section 82 shown in FIG. 1. The evaluating/adjusting section 25 is a functional block realized by causing a processor section of the baseband processor 24 to execute a program (power consumption controlling program) for measuring the signal quality (BER) and adjusting the parameters to control the power consumption of the power amplifier 16.

In the time division duplex system 11 arranged as above, a loopback path is formed as follows: in the adjusting mode, the mode selector switches 13 and 14 connects the attenuator 21 with the power amplifier 16 and the low noise amplifier 19. With this, a test transmitting data outputted from the evaluating/adjusting section 25 is converted into the transmitting signal by the RF transmitter 15, the transmitting signal is amplified by the power amplifier 16, the amplified transmitting signal is attenuated by the attenuator 21 and then amplified by the low noise amplifier 19, and then the transmitting signal is converted into the receiving data by the RF receiver 20. Meanwhile, the transmitting power of the transmitting signal having passed through the attenuator 21 is measured by the power measuring circuit 22. In addition, the power consumption of the power amplifier 16 is measured by the power consumption measuring circuit in accordance with the output of the DC-DC converter 18.

Like the property evaluating section 81 and the parameter adjusting section 82, the evaluating/adjusting section 25 checks a reception property in accordance with the receiving data, and also checks the transmitting power and the power consumption. Based upon check results, adjusting parameters are generated. Then, the above process is repeated until the power consumption of the power amplifier 16 becomes minimum while maintaining the predetermined transmitting power and the signal quality.

The frequency division duplex system 31 is a system which carries out frequency division duplex (FDD) and is preferably used in, for example, a mobile phone. The FDD is one of methods for realizing simultaneous transmission/reception (duplex communication) in, for example, wireless communication. According to the FDD, by dividing the frequency band of the communication path into the frequency band for transmission and the frequency band for reception, the transmission and the reception are carried out at the same time.

The frequency division duplex system 31 includes an antenna 32, a mode selector switch 33, a receiving switch 34, an RF transmitter 35, a power amplifier 36, a digital-analog converter (DAC in FIG. 7) 37, a DC-DC converter 38, an RF receiver 39, a low noise amplifier (LNA in FIG. 7) 40, an RF receiver 41, an attenuator 42, a power measuring circuit 43, a TX frequency synthesizer 44, an RX frequency synthesizer 45, and a baseband processor 46. The baseband processor 46 further includes an evaluating/adjusting section 47. An FDD system section is generally composed of the RF transmitter 35, the power amplifier 36, the DC-DC converter 38, the low noise amplifier 40, the RF receiver 41, the TX frequency synthesizer 44, the RX frequency synthesizer 45 and the baseband processor 46.

The RF transmitter 35, the power amplifier 36, the DC-DC converter 38, the RF receiver 39, the power measuring circuit 43 correspond to the RF transmitting circuit 2, the RF power amplifier 3, the programmable regulator 6, the RF receiving circuit 5, and the transmitting power measuring circuit 4 in FIG. 1, respectively.

In the frequency division duplex system 31, the transmitting signal and the receiving signal use different frequency band. Therefore, the RF receiver 41 cannot be utilized as the loopback circuit (RF receiving circuit 5). On this account, the frequency division duplex system 31 additionally requires the RF receiver 39 which demodulates the transmitting signal, provided from the power amplifier 36, at the same carrier frequency as that used for the transmission and then provides the demodulated transmitting signal to the baseband processor 46. On this account, by adding to the FDD system the mode selector switch 33, the digital-analog converter 37, the attenuator 42, the transmitting power measuring circuit 43, the evaluating/adjusting section 47, and a power consumption measuring circuit (having functions equivalent to those of the power consumption measuring circuit 7, not shown in FIG. 7), it becomes possible to carry out the power supply adopting adjustment which is realized in the transmitting system 1 shown in FIG. 1.

The mode selector switch 33 is a switch which selects the normal transmission/reception mode or the adjusting mode. In the normal transmission/reception mode, the mode selector switch 33 connects the antenna 32 with the power amplifier 36. Meanwhile, in the adjusting mode, the mode selector switch 33 connects the attenuator 42 with the power amplifier 36. In the normal transmission/reception mode, the receiving switch 34 connects the antenna 32 with the low noise amplifier 40. Switching operations carried out by the mode selector switch 33 are controlled by the baseband processor 46 or another control section.

The digital-analog converter 37 converts power supply voltage adjusting data DPV2 and bias voltage adjusting data DBV2 into power supply voltage adjusting signal ADJP2 and bias voltage adjusting signal ADJB2, respectively. Here, the power supply voltage adjusting data DPV2 and the bias voltage adjusting data DBV2 are outputted from the evaluating/adjusting section 47, and the power supply voltage adjusting signal ADJP2 and the bias voltage adjusting signal ADJB2 are analog signals. The power supply voltage adjusting signal ADJP2 is provided to the DC-DC converter 38, and the bias voltage adjusting signal ADJB2 is provided to the power amplifier 36. The digital-analog converter 37 may be contained in the baseband processor 46.

The attenuator 42 attenuates the transmitting signal from the power amplifier 36 so that the power of the transmitting signal can be measured by the power measuring circuit 43.

The evaluating/adjusting section 47 includes the property evaluating section 81 and the parameter adjusting section 82 shown in FIG. 1. The evaluating/adjusting section 47 is a functional block realized by causing a processor section of the baseband processor 46 to execute a program (power consumption controlling program) for measuring the signal quality (BER) and adjusting the parameters.

In the frequency division duplex system 31 arranged as above, a loopback path is formed as follows: in the adjusting mode, the mode selector switch 33 connects the attenuator 42 with the power amplifier 36. With this, a test transmitting data outputted from the evaluating/adjusting section 47 is converted into the transmitting signal by the RF transmitter 35, the transmitting signal is amplified by the power amplifier 36, the amplified transmitting signal is attenuated by the attenuator 42, and then the attenuated transmitting signal is converted into the receiving data by the RF receiver 39. Meanwhile, the transmitting power of the transmitting signal attenuated by the attenuator 42 is measured by the power measuring circuit 43. In addition, the power consumption of the power amplifier 36 is measured by the power consumption measuring circuit in accordance with the output of the DC-DC converter 38.

Like the property evaluating section 81 and the parameter adjusting section 82, the evaluating/adjusting section 47 checks a reception property in accordance with the receiving data, and also checks the transmitting power and the power consumption. Based upon check results, the adjusting parameters are generated. Then, the above process is repeated until the power consumption of the power amplifier 36 becomes minimum while maintaining the predetermined transmitting power and the signal quality.

Note that the present embodiment has explained an example in which the present invention is applied to the wireless communication system. However, the present invention can be applied to any system as long as the system includes an amplifier which amplifies a high frequency signal.

The following is a summary of the present embodiment.

A power consumption controlling apparatus controls power consumption of a high frequency amplifier, which amplifies a high frequency transmitting signal, to reduce the power consumption by adjusting a power supply voltage and a bias voltage of the high frequency amplifier, and the power consumption controlling apparatus includes: a receiving circuit for receiving the high frequency transmitting signal amplified by the high frequency amplifier; an evaluating section for evaluating whether or not a receiving signal obtained from the receiving circuit satisfies a predetermined quality; and an adjusting section for adjusting the power supply voltage and the bias voltage in a range in which the receiving signal evaluated by the evaluating section satisfies the predetermined quality.

According to the above arrangement, the evaluating section evaluates whether or not the receiving signal obtained from the receiving circuit satisfies a predetermined quality. Thus, by evaluating the quality of the receiving signal, the quality of the transmitting signal is evaluated. Then, the power supply voltage and the bias voltage are adjusted by the adjusting section to reduce the power consumption of the high frequency amplifier in a range in which the receiving signal satisfies a predetermined quality, that is, in a range in which the high frequency transmitting signal satisfies a predetermined quality. With this, it becomes possible to reduce the power consumption of the high frequency amplifier while maintaining the required quality of the high frequency transmitting signal.

It is preferable that (i) the power consumption controlling apparatus include: a transmitting power measuring circuit for measuring power of the high frequency transmitting signal; and a power consumption measuring circuit for measuring the power consumption of the high frequency amplifier, and (ii) the adjusting section adjust the power supply voltage and the bias voltage to maximize efficiency of the high frequency amplifier, the efficiency being found based on the power and the power consumption thus measured.

According to the above arrangement, the power supply voltage and the bias voltage are adjusted by the adjusting section to maximize the efficiency found based upon the measured power and the measured power consumption. Here, the efficiency of the high frequency amplifier is found by dividing the power by the power consumption. With this, it becomes possible to operate the high frequency amplifier with low power consumption but high efficiency.

Moreover, a high frequency communication apparatus includes: a transmitting circuit which outputs the high frequency transmitting signal; the high frequency amplifier; and the power consumption controlling apparatus. With this, it becomes possible to reduce the power consumption of the high frequency communication apparatus while maintaining a required quality of the high frequency transmitting signal.

Moreover, a power consumption controlling method controls power consumption of a high frequency amplifier, which amplifies a high frequency transmitting signal, to reduce the power consumption by adjusting a power supply voltage and a bias voltage of the high frequency amplifier, and the power consumption controlling method includes the steps of: evaluating whether or not the high frequency transmitting signal amplified by the high frequency amplifier satisfies a predetermined quality; and adjusting the power supply voltage and the bias voltage in a range in which a receiving signal evaluated in the evaluating step satisfies the predetermined quality.

The above method evaluates whether or not the high frequency transmitting signal satisfies a predetermined quality, and then adjusts the power supply voltage and the bias voltage so that the power consumption of the high frequency amplifier is reduced while the high frequency transmitting signal satisfies a predetermined quality. With this, it becomes possible to reduce the power consumption of the high frequency amplifier while maintaining the required quality of the high frequency transmitting signal.

It is preferable that, in the power consumption controlling method, the power supply voltage and the bias voltage be adjusted to maximize the efficiency of the high frequency amplifier, the efficiency being found based upon measured power of the high frequency transmitting signal and measured power consumption of the high frequency amplifier. As above, the power supply voltage and the bias voltage are adjusted to maximize the efficiency found based upon the measured power and the measured power consumption. With this, it becomes possible to operate the high frequency amplifier with low power consumption but high efficiency.

The evaluating step and the adjusting step may be realized by causing a computer to execute the power consumption controlling program.

As above, according to the power consumption controlling apparatus and the method for controlling the power consumption, it is possible to reduce the power consumption of the high frequency amplifier while maintaining the quality of the high frequency transmitting signal in a predetermined range in accordance with the evaluation of the quality of the high frequency transmitting signal. Therefore, it is possible to reduce the power consumption of a high frequency transmitting signal outputting apparatus including the high frequency amplifier while maintaining a predetermined quality of the high frequency transmitting signal.

Moreover, the power consumption controlling apparatus and the method for controlling the power consumption can reduce the power consumption while maintaining a predetermined signal quality in a system including a power amplifier which amplifies the high frequency signal. Therefore, the power consumption controlling apparatus and the method for controlling the power consumption can preferably be applied to, for example, an RF analog circuit in a wireless LAN, a mobile phone, or the like.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A power consumption controlling apparatus for controlling power consumption of a high frequency amplifier, which amplifies a high frequency transmitting signal, to reduce the power consumption by adjusting a power supply voltage and a bias voltage of the high frequency amplifier, the power consumption controlling apparatus comprising:

a receiving circuit for receiving the high frequency transmitting signal amplified by the high frequency amplifier;

an evaluating section providing an evaluation by evaluating whether or not a receiving signal obtained from the receiving circuit satisfies a predetermined quality;

a transmitting power measuring circuit providing a measured power by measuring power of the high frequency transmitting signal;

a power consumption measuring circuit providing a measured power consumption by measuring the power consumption of the high frequency amplifier; and an adjusting section for adjusting the power supply voltage and the bias voltage to maximize efficiency of the high frequency amplifier, where the efficiency being found is based on the measured power, the measured power consumption, and the evaluation.

2. The power consumption controlling apparatus as set forth in claim 1, wherein the evaluating section checks whether or not bit error rate of the receiving signal from the receiving circuit is equal to or less than a predetermined value, checks whether or not the transmitting power supplied from the transmitting power measuring circuit has a value in a predetermine range, and outputs power consumption being sequentially measured by the power consumption measuring circuit with check results of the bit error rate and the transmitting power corresponding to the check results; and the adjusting section repeats a step in accordance with the check results from the evaluating section so as to ensure the bit error rate of the receiving signal is equal to or less than the predetermined value, the transmitting power supplied from the transmitting power measuring circuit has a value in a predetermined range, and the power consumption of the high frequency amplifier is minimum, in which a process is reducing the bias voltage at a predetermined interval from an initial point until, (A) limit of adjustment of the bias voltage capable of maintaining the transmitting power in a predetermined range occurs among transmitting powers, bit error rates and power consumptions measured at sequential measuring points formed by reducing the bias voltage at the predetermined interval, or (B) lower limit of the bias voltage occurs.

3. A high frequency communication apparatus comprising:
a transmitting circuit for outputting a high frequency transmitting signal;
a high frequency amplifier for amplifying the high frequency transmitting signal outputted from the transmitting circuit; and
a power consumption controlling apparatus for controlling power consumption of the high frequency amplifier to reduce the power consumption by adjusting a power supply voltage and a bias voltage of the high frequency amplifier, the power consumption controlling apparatus comprising:
a loopback circuit for receiving the high frequency transmitting signal amplified by the high frequency amplifier;
an evaluating section providing an evaluation by evaluating whether or not a receiving signal obtained from the loopback circuit satisfies a predetermined quality;
a transmitting power measuring circuit providing a measured power by measuring power of the high frequency transmitting signal;
a power consumption measuring circuit providing a measured power consumption by measuring the power consumption of the high frequency amplifier; and
an adjusting section for adjusting the power supply voltage and the bias voltage to maximize efficiency of the high frequency amplifier, where the efficiency being found is based on the measured power, the measured power consumption, and the evaluation.

4. The high frequency communication apparatus as set forth in claim 3, wherein
the evaluating section checks whether or not bit error rate of the receiving signal from the receiving circuit is equal to or less than a predetermined value, checks whether or not the transmitting power supplied from the transmitting power measuring circuit has a value in a predetermine range, and outputs power consumption being sequentially measured by the power consumption measuring circuit with check results of the bit error rate and the transmitting power corresponding to the check results; and
the adjusting section repeats a step in accordance with the check results from the evaluating section so as to ensure the bit error rate of the receiving signal is equal to or less than the predetermined value, the transmitting power supplied from the transmitting power measuring circuit has a value in a predetermined range, and the power consumption of the high frequency amplifier is minimum, in which a process is
reducing the bias voltage at a predetermined interval from an initial point until, (A) limit of adjustment of the bias voltage capable of maintaining the transmitting power in a predetermined range occurs among transmitting powers, bit error rates and power consumptions measured at sequential measuring points formed by reducing the bias voltage at the predetermined interval, or (B) lower limit of the bias voltage occurs.

5. The high frequency communication apparatus as set forth in claim 3 arranged as a time division duplex system, the high frequency communication apparatus further comprising:
an antenna for transmission and reception; and
a selector circuit for connecting the high frequency amplifier with the loopback circuit when the evaluating section carries out evaluation and the adjusting section carries out adjustment, and for (i) connecting the high frequency amplifier with the antenna and (ii) connecting the loopback circuit with the antenna when a communication is carried out,
the loopback circuit also serving as a receiving circuit for receiving a high frequency receiving signal supplied from the antenna.

6. The high frequency communication apparatus as set forth in claim 3 arranged as a frequency division duplex system, the high frequency communication apparatus further comprising:
an antenna for transmission and reception;
a receiving circuit for receiving a high frequency receiving signal supplied from the antenna;
a selector circuit for connecting the high frequency amplifier with the loopback circuit when the evaluating section carries out evaluation and the adjusting section carries out adjustment, and for connecting the high frequency amplifier with the antenna when a communication is carried out; and
a connecting circuit for connecting the receiving circuit with the antenna when a communication is carried out.

7. A method for controlling power consumption of a high frequency amplifier, which amplifies a high frequency transmitting signal, to reduce the power consumption by adjusting a power supply voltage and a bias voltage of the high frequency amplifier, the method comprising the steps of:
providing an evaluation by evaluating whether or not the high frequency transmitting signal amplified by the high frequency amplifier satisfies a predetermined quality;
providing a measured power by measuring power of the high frequency transmitting signal;
providing a measured power consumption by measuring the power consumption of the high frequency amplifier; and
adjusting the power supply voltage and the bias voltage to maximize efficiency of the high frequency amplifier, where the efficiency being found is based on the measured power, the measured power consumption, and the evaluation.

8. The method as set forth in claim 7, wherein
the evaluating section checks whether or not bit error rate of the receiving signal from the receiving circuit is equal to or less than a predetermined value, checks whether or not the transmitting power supplied from the transmitting power measuring circuit has a value in a predetermine range, and outputs power consumption being sequentially measured by the power consumption measuring circuit with check results of the bit error rate and the transmitting power corresponding to the check results; and
the adjusting section repeats a step in accordance with the check results from the evaluating section so as to ensure the bit error rate of the receiving signal is equal to or less than the predetermined value, the transmitting power supplied from the transmitting power measuring circuit has a value in a predetermined range, and the power consumption of the high frequency amplifier is minimum, in which a process is
reducing the bias voltage at a predetermined interval from an initial point until, (A) limit of adjustment of the bias voltage capable of maintaining the transmitting power in a predetermined range occurs among transmitting powers, bit error rates and power consumptions measured at sequential measuring points formed by reducing the bias voltage at the predetermined interval, or (B) lower limit of the bias voltage occurs.

9. A Memory having instructions stored thereon, such that when the instructions are read and executed by a processor, the processor controls power consumption of a high frequency amplifier that amplifies a high frequency transmitting signal to reduce the power consumption by adjusting a power supply voltage and a bias voltage of the high frequency amplifier, wherein the processor is configured to perform the steps of: providing an evaluation by evaluating whether or not the high frequency transmitting signal amplified by the high frequency amplifier satisfies a predetermined quality; providing a measured power by measuring power of the high frequency transmitting providing a measured power consumption by measuring the power consumption of the high frequency amplifier; and adjusting the power supply voltage and the bias voltage to maximize efficiency of the high frequency amplifier, where the efficiency being found is based on the measured power, the measured power consumption, and the evaluation.

10. The processor as set forth in claim 9, wherein
the evaluating section checks whether or not bit error rate of the receiving signal from the receiving circuit is equal to or less than a predetermined value, checks whether or not the transmitting power supplied from the transmitting power measuring circuit has a value in a predetermine range, and outputs power consumption being sequentially measured by the power consumption measuring circuit with check results of the bit error rate and the transmitting power corresponding to the check results; and the adjusting section repeats a step in accordance with the check results from the evaluating section so as to ensure the bit error rate of the receiving signal is equal to or less than the predetermined value, the transmitting power supplied from the transmitting power measuring circuit has a value in a predetermined range, and the power consumption of the high frequency amplifier is minimum, in which a process is reducing the bias voltage at a predetermined interval from an initial point until, (A) limit of adjustment of the bias voltage capable of maintaining the transmitting power in a predetermined range occurs among transmitting powers, bit error rates and power consumptions measured at sequential measuring points formed by reducing the bias voltage at the predetermined interval, or (B) lower limit of the bias voltage occurs.

\* \* \* \* \*